United States Patent [19]

Takahashi

[11] Patent Number: 5,314,574
[45] Date of Patent: May 24, 1994

[54] SURFACE TREATMENT METHOD AND APPARATUS

[75] Inventor: Nobuaki Takahashi, Hachioji, Japan

[73] Assignee: Tokyo Electron Kabushiki Kaisha, Tokyo, Japan

[21] Appl. No.: 81,052

[22] Filed: Jun. 25, 1993

[30] Foreign Application Priority Data

Jun. 26, 1992 [JP] Japan .................. 4-192876

[51] Int. Cl.$^5$ .................. H01L 21/306; B44C 1/22
[52] U.S. Cl. .................. 156/646; 156/345; 118/719; 118/729
[58] Field of Search .............. 156/637, 639, 646, 657, 156/662, 345; 414/217, 592, 744.1, 744.2, 744.5; 427/248.1; 118/715, 719, 729, 730, 732

[56] References Cited

U.S. PATENT DOCUMENTS

| | | | |
|---|---|---|---|
| 4,654,106 | 3/1987 | Davis et al. .................. | 156/345 |
| 4,857,142 | 8/1989 | Syverson .................. | 156/646 |
| 5,169,408 | 12/1992 | Biggerstaff et al. .................. | 156/646 X |
| 5,248,380 | 9/1993 | Tanaka .................. | 156/646 X |

Primary Examiner—William Powell
Attorney, Agent, or Firm—Beveridge, DeGrandi, Weilacher & Young

[57] ABSTRACT

In order to remove oxides produced as a result of natural oxidation, from a semiconductor wafer, the semiconductor wafer is transported into a preparatory chamber filled with an inert gas via a loading/unloading passage and held by open/close pins of a loading platform atop an intermediate cover lowered in the preparatory chamber; the intermediate cover then raises, the preparatory chamber and an intermediate chamber located immediately above the preparatory chamber are isolated; and the loading platform and the semiconductor wafer thereon are positioned in the intermediate chamber. Thereafter, a closed open/close cover located at the upper part of the intermediate chamber opens upward; a treatment gas from a treatment gas atmosphere chamber located immediately above the intermediate chamber flows into the intermediate chamber; and a process is performed for removing oxidation film from the semiconductor wafer surface. Then, the open/close cover lowers to isolate the treatment gas atmosphere chamber from the intermediate chamber, and by supplying an inert gas, treatment gas in the intermediate chamber is exhausted, and afterwards, the intermediate cover lowers, and the treated object is transported via the loading/unloading passage from the preparatory chamber to a load lock chamber. Thus, leakage of the treatment gas to the outside is prevented.

12 Claims, 8 Drawing Sheets

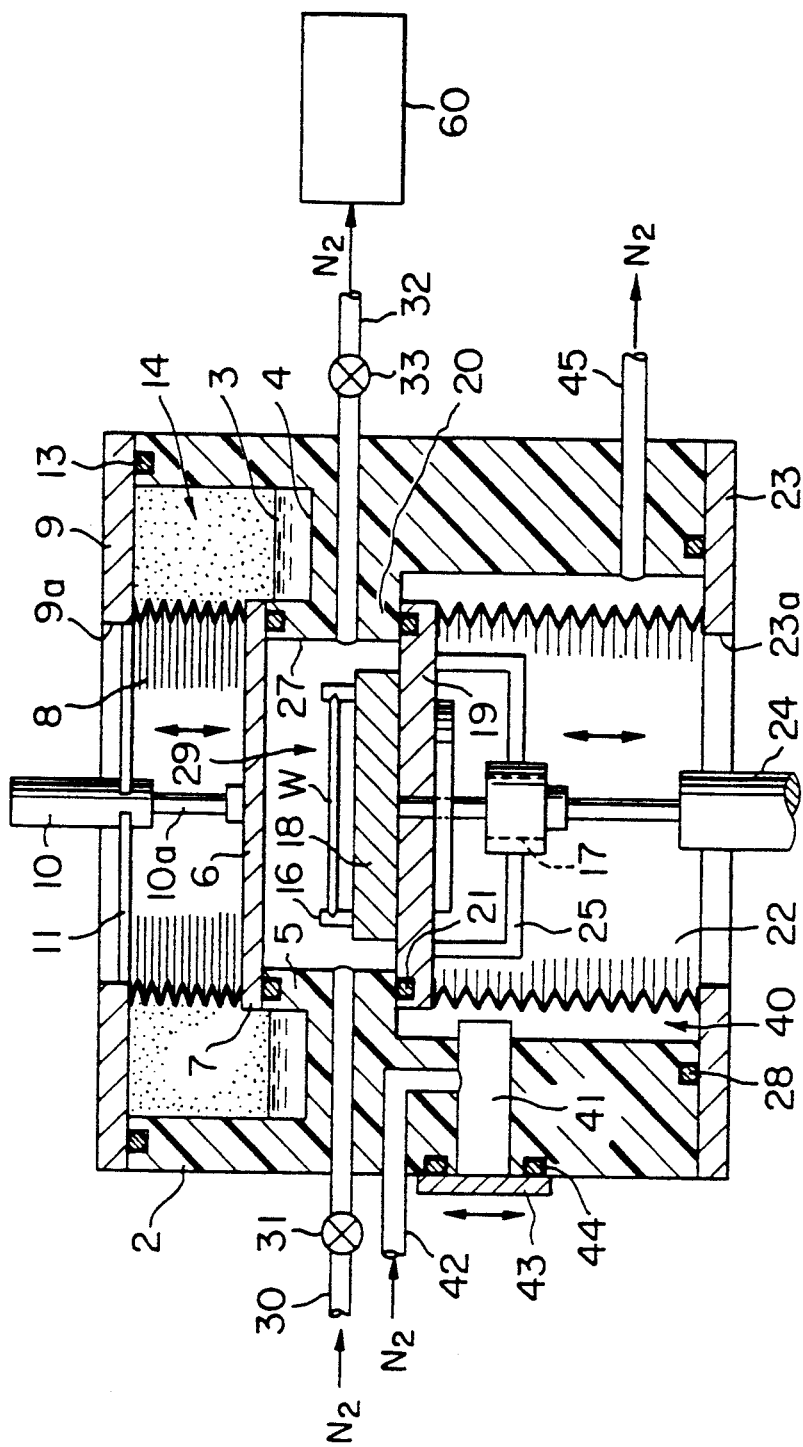
F I G. 1

SURFACE TREATMENT METHOD AND APPARATUS

BACKGROUND OF THE INVENTION

The present invention relates to a method and apparatus for surface treatment of such objects as semiconductor wafers.

Among conventional semiconductor wafer film forming apparatus of this type is a wafer surface treatment apparatus, in which a semiconductor wafer is contained in a treatment chamber and rotated while being exposed to a treatment gas atmosphere. The treatment gas thus acts uniformly on the semiconductor wafer surface so as to perform uniform surface treatment.

For example, in the case of a natural oxidation film removal apparatus for removing a natural oxide film formed on the semiconductor wafer, a predetermined liquid, for example, a mixture of hydrofluoric acid and water, is placed at the bottom section of a treatment chamber under normal or raised pressure. The produced hydrofluoric acid vapor is then dispersed within the treatment chamber.

At the upper section in this treatment chamber, the semiconductor wafer is arranged with the surface to be treated faced downwards. While the semiconductor wafer is being rotated, the hydrofluoric acid vapor acts on the semiconductor wafer surface so as to remove natural oxide film.

When surface treatment is performed using for example hydrofluoric acid solvent vapor, since this vapor is corrosive to metals such as heavy metals, the treatment object insertion and removal procedures with respect to the treatment chamber need to be performed without even a minute quantity of treatment gas leakage to the exterior from the treatment gas atmosphere chamber and treatment chamber.

However, in the case of conventional treatment apparatus in which the treatment chamber and a preparatory chamber for insertion and removal are used in common, and the treatment gas atmosphere chamber is provided at the bottom section of the treatment chamber, problems are encountered such as vapor leakage to the treatment chamber and, although in minute amounts, treatment gas also leaks to the exterior.

SUMMARY OF THE INVENTION

Consequently, an object of this invention is to provide a surface treatment method and apparatus that allow reducing the leakage of treatment gas to the exterior.

In order to achieve the above objective, according to an aspect of this invention, there is provided a method for surface treating of a treatment object comprising the steps of: transporting a treatment object into a preparatory chamber filled with an inert gas and holding the treatment object on a loading platform atop an intermediate cover in the preparatory chamber; closing the preparatory chamber with respect to the exterior; moving the intermediate cover toward an intermediate chamber located adjacent to and communicating with the preparatory chamber, so as to position the loading platform atop the intermediate cover and the treatment object held thereon in the intermediate chamber and to hermetically isolate the preparatory chamber and the intermediate chamber by the intermediate cover; opening an open/close cover, capable of communicating the intermediate chamber with a treatment gas atmosphere chamber adjacent thereto, to cause a treatment gas in the treatment gas atmosphere chamber to flow into the intermediate chamber and to cause the treatment gas to act on the treatment object; closing the open/close cover to isolate the treatment gas atmosphere chamber and the intermediate chamber; introducing an inert gas into the intermediate chamber to purge the treatment gas in the intermediate chamber to the exterior; moving the intermediate cover away from the intermediate chamber to communicate the intermediate chamber and the preparatory chamber and to cause the treatment object on the loading platform to be positioned in the preparatory chamber; and opening the preparatory chamber to the exterior to transport the treatment object to the exterior.

According to another aspect of this invention, there is provided a surface treatment apparatus for a treatment object comprising: a container; preparatory chamber means formed in the container for receiving the treatment object; loading/unloading passage means provided in the container for transporting the treatment object into and removing the treatment object from the preparatory chamber; intermediate chamber means formed in the container adjacent to the preparatory chamber means; treatment gas atmosphere chamber means including a treatment gas therein and positioned in the container adjacent to the intermediate chamber means; an intermediate cover positioned within the intermediate chamber means and having a loading platform for receiving and holding thereon the treatment object, the intermediate cover being movable between a rearward position allowing transporting the treatment object via the loading/unloading passage means to and from the loading platform and a forward position for positioning the treatment object held on the loading platform in the intermediate chamber means so as to mutually and hermetically seal the preparatory chamber means and the intermediate chamber means; drive means for shifting the intermediate cover between said rearward position and said forward position; an open/close cover positioned between the intermediate chamber means and the treatment gas atmosphere chamber means for mutually and hermetically sealing both the chamber means; and drive means for moving the open/close cover when the intermediate cover is at the forward position, so as to expose the treatment object on the loading platform in the intermediate chamber means to the treatment gas and to communicate the intermediate chamber with the treatment gas atmosphere chamber.

According to this invention, since the intermediate chamber is completely isolated from the preparatory chamber by the intermediate cover prior to introducing the treatment gas in the intermediate chamber, treatment gas leakage via the preparatory chamber to the exterior can be prevented.

Further, after the treatment of the object by the treatment gas, the intermediate cover is opened after completely exhausting the residual treatment gas from the intermediate chamber, so that residual treatment gas leakage via the preparatory chamber to the exterior can be prevented.

BRIEF DESCRIPTION OF THE DRAWINGS

FIG. 1 is a schematic vertical cross sectional view of a first embodiment of this invention as a natural oxidation film removing apparatus.

DESCRIPTION OF THE PREFERRED EMBODIMENT

Figure 2:
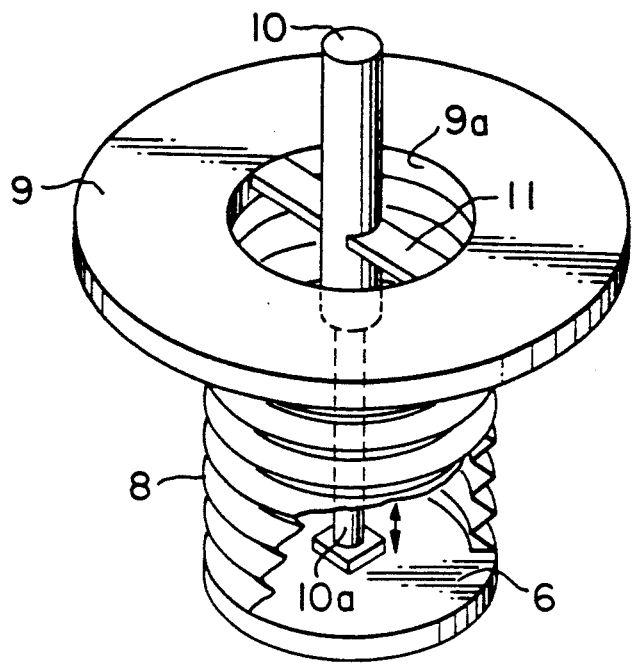
FIG. 2 is a perspective view showing a drive mechanism for vertical movement of an open/close cover of the embodiment shown in FIG. 1.

A preferred embodiment of this invention will be described below with reference to the attached drawings.

A wafer surface treatment apparatus in a form of a natural oxidation film removing apparatus is generally indicated by reference numeral 1 in FIG. 1. This natural oxidation film removing apparatus 1 is provided with a vertically arranged cylindrical container 2 made of a corrosion resistant material, such as fluorinated resin.

At the upper part of the inside of this container 2, an annular liquid containing chamber 4 is provided for containing a predetermined treatment liquid, for example, a mixture 3 of hydrofluoric acid and water. This liquid containing chamber 4 is internally defined by a rising inner circumference wall 5, at the top of which is placed a circular open/close cover 6 equal in diameter to the outer circumference of the inner circumference wall 5. At the upper face of the inner circumference wall 5, a first ring shaped sealing member 7 made of an anti-corrosion material is provided in order to tightly seal the liquid containing chamber 4 with the open/close cover 6.

As shown in FIG. 2, at the outer circumference end of the open/close cover 6, the inner side of one end (lower end in the figure) of a first bellows 8 is hermetically connected. The bellows 8 is a cylindrical hollow tube formed of a corrosion resistant material that is freely stretchable and compressible. The other end (upper end in the figure) of this bellows 8 is hermetically sealed to a ceiling cover 9.

This ceiling cover 9 is formed of a corrosion resistant material as a flat circular plate, at the inner side of which a circular opening 9a smaller than the inner diameter of the bellows 8 is provided.

As shown in FIG. 2, a raising and lowering mechanism, for example an air cylinder 10, for raising and lowering the open/close cover 6 and a supporting means 11 for supporting the cylinder are fixedly installed at the inner side of the opening 9a. The end of a piston rod 10a driven up and down by this air cylinder 10 is secured to the upper surface of the open/close cover 6. The above mechanism constitutes a raising-lowering, opening-closing mechanism.

An annular second sealing member 13 made of a corrosion resistant material is interposed between the outer circumference edge of the ceiling cover 9 and the upper face of the container 2, as indicated in FIG. 1, for hermetic sealing of the cover 9 to the container 2. Thus, an annular treatment gas atmosphere chamber 14 is constructed.

In addition, an intermediate chamber 29 is provided below the open/close cover 6. In this intermediate chamber 29, a vertical open/close pins 16 are provided which can engage and disengage a treatment object, for example, a semiconductor wafer W. These pins 16 project upward above the upper face of a loading platform 18, which can be rotated by a rotating means, such as a motor 17 as shown in FIG. 3.

Figure 4:
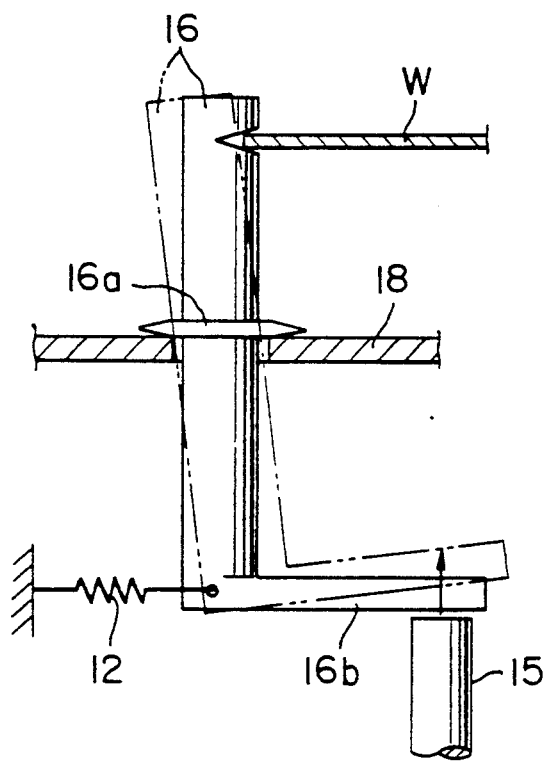
FIG. 4 is a view showing the principle of opening and closing treatment object grasping pins.

The pins 16 are opened and closed by a known mechanism, for example, a mechanism such as indicated in FIG. 4. Each pin 16 is supported on the loading platform 18 by an intermediate flange 16a, and extends downward through the loading platform 18 where a tension spring 12 acts on the lower end of the pin. In the FIG. 4 state, a notch of the pin 16 is engaged with the edge of the wafer W and supports the same. A bent arm 16b is formed at the bottom of the pin 16. When this bent arm 16b is pressed upward against the force of the spring 12, as indicated by the arrow, by a plunger 15 of a drive means (not shown), as indicated by the imaginary lines, the wafer W is released.

The loading platform 18 is arranged atop the intermediate cover 19. For sealing against an annular shoulder 20 projecting inwardly from the container 2, the circumference edge of the intermediate cover 19 has a third sealing member 21 made of a corrosion resistant material. When the intermediate cover 19 is pressed upward against the shoulder 20, a hermetically sealed condition is established.

Figure 3:
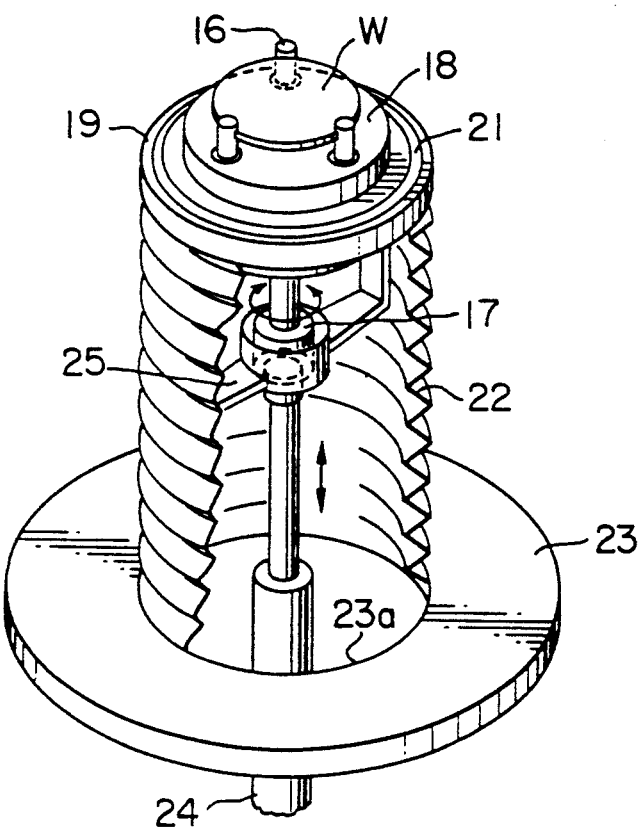
FIG. 3 is a perspective view of a drive mechanism for an intermediate cover in the embodiment shown in FIG. 1.

In addition, as indicated in FIG. 3, one end (upper end in the figure) of a second bellows 22, made of a cylindrical hollow inner tube that is freely expandable and compressible and formed of a corrosion resistant material, is hermetically connected to the outer circumference edge of the intermediate cover 19. The other end (lower end in the figure) of this bellows 22 is hermetically connected to a bottom cover 23.

This bottom cover 23 is formed of a corrosion resistant material as a ring shaped flat plate. At the inner side of the cover 23 is provided a circular opening 23a with its inner diameter smaller than the bellows 22. At the inner side of this opening 23a and the inner side of the bellows 22, are provided the above mentioned motor 17 for rotating the loading platform 18 and a raising and lowering mechanism, for example, an air cylinder 24 for raising and lowering the intermediate cover 19. The motor 17 is retained by a retaining member 25 secured to the bottom section of the intermediate cover 19.

As indicated in FIG. 1, the upper face of the outer circumference edge of the bottom cover 23 is secured to the container 2 through a fourth annular sealing member 28 made of a corrosion resistant material and provided at the lower bottom face of the container 2, whereby the bottom face of the container 2 is hermetically sealed.

For supplying a predetermined gas, for example N2, a supply tube 30 is connected via a first open/close valve 31 to one side of the intermediate chamber 29. At the other side of the chamber 29, a first exhaust tube 32 for exhausting the N2 gas is connected via a second open/close valve 32. In addition, a treatment gas exhaust and removal means 60 is connected to the exhaust tube 32. The treatment gas exhaust and removal means 60 comprises such means as the plant exhaust system or a vacuum pump.

The intermediate chamber 29 becomes the treatment chamber for chemical treatment of the semiconductor wafer W by opening the open/close cover 6 in the upward direction.

A preparatory chamber 40 is provided below the intermediate chamber 29. This preparatory chamber is defined by the intermediate cover 19, the bottom cover 23 and the container 2.

Through one side wall of the preparatory chamber 40, a loading/unloading passage 41 is opened for transporting in and transporting out the semiconductor wafer W. An introducing tube 42 is connected at an interim position of the loading/unloading passage 41 for introducing inert gas, for example N2.

At another side wall of the preparatory chamber 40, a second exhaust tube 45 is connected for exhausting the N2 gas. In addition, for opening and closing the loading/unloading passage 41, an open/close door, for example a gate valve 43, is provided via a fifth sealing member 44 made of a corrosion resistant material so as to hermetically seal the container 2.

Figure 8:
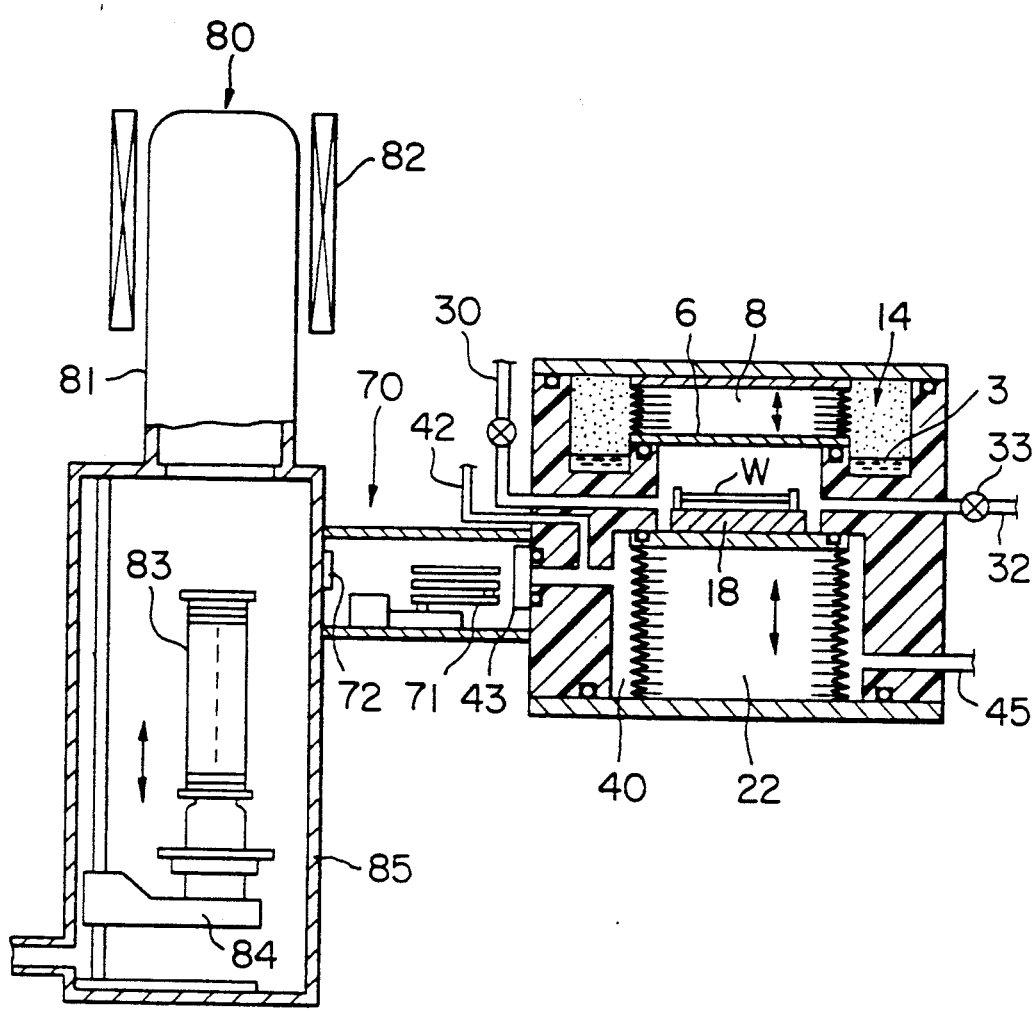
FIG. 8 is a cross sectional view, taken along line VIII—VIII of FIG. 9, of a semiconductor wafer treatment apparatus incorporating the natural oxidation film removing apparatus shown in FIG. 1.

As indicated in FIG. 8, the semiconductor wafer film forming apparatus partially shown therein is provided with a robot chamber 70 hermetically connected with the preparatory chamber 40 via the gate valve 43. This robot chamber 70 is constructed so as to allow transporting the semiconductor wafer W into and out of the preparatory chamber 40 by a wafer transporting mechanism 71.

In order to set the robot chamber 70 to a vacuum atmosphere and to enable setting the chamber to an oxygen-free N2 atmosphere, a commonly known vacuum exhaust device and a N2 supply device (not shown in the figure) are connected in the robot chamber 70.

Figure 9:
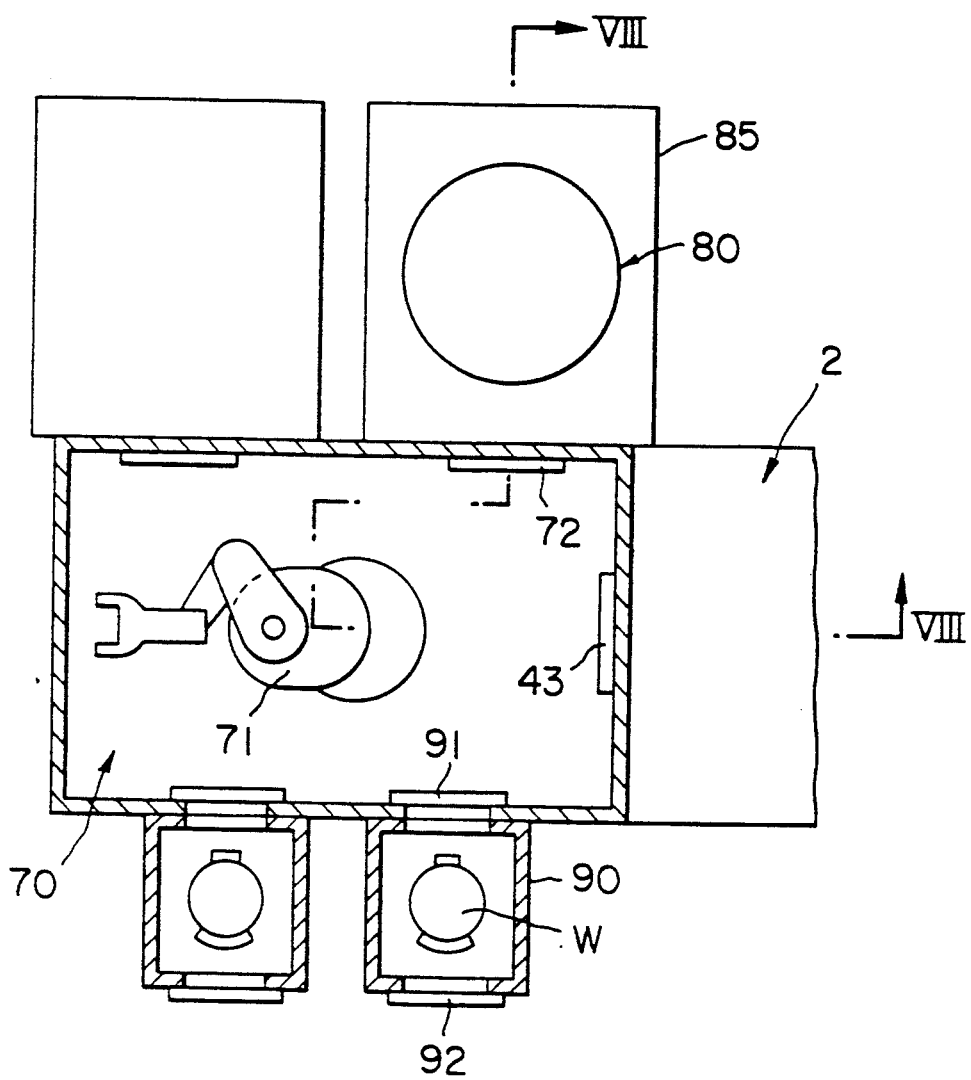
FIG. 9 is a plane view of FIG. 8.

In addition, the robot chamber 70 is connected via a gate valve 72 to a heat treatment apparatus, for example a CVD (chemical vapor deposition) apparatus 80, so as to allow transporting in and out the semiconductor wafer W in an N2 atmosphere. As indicated in FIG. 9, the robot chamber 70 is further connected via a gate valve 91 to a known wafer in/out transport chamber 90 for transporting the semiconductor wafer into and out of the natural atmosphere. The wafer in/out transport chamber 90 constitutes a load lock chamber and has a gate valve 92 between itself and the atmosphere.

The following is a description of the operation of the embodiment of the invention constructed in the above manner.

Figure 5:
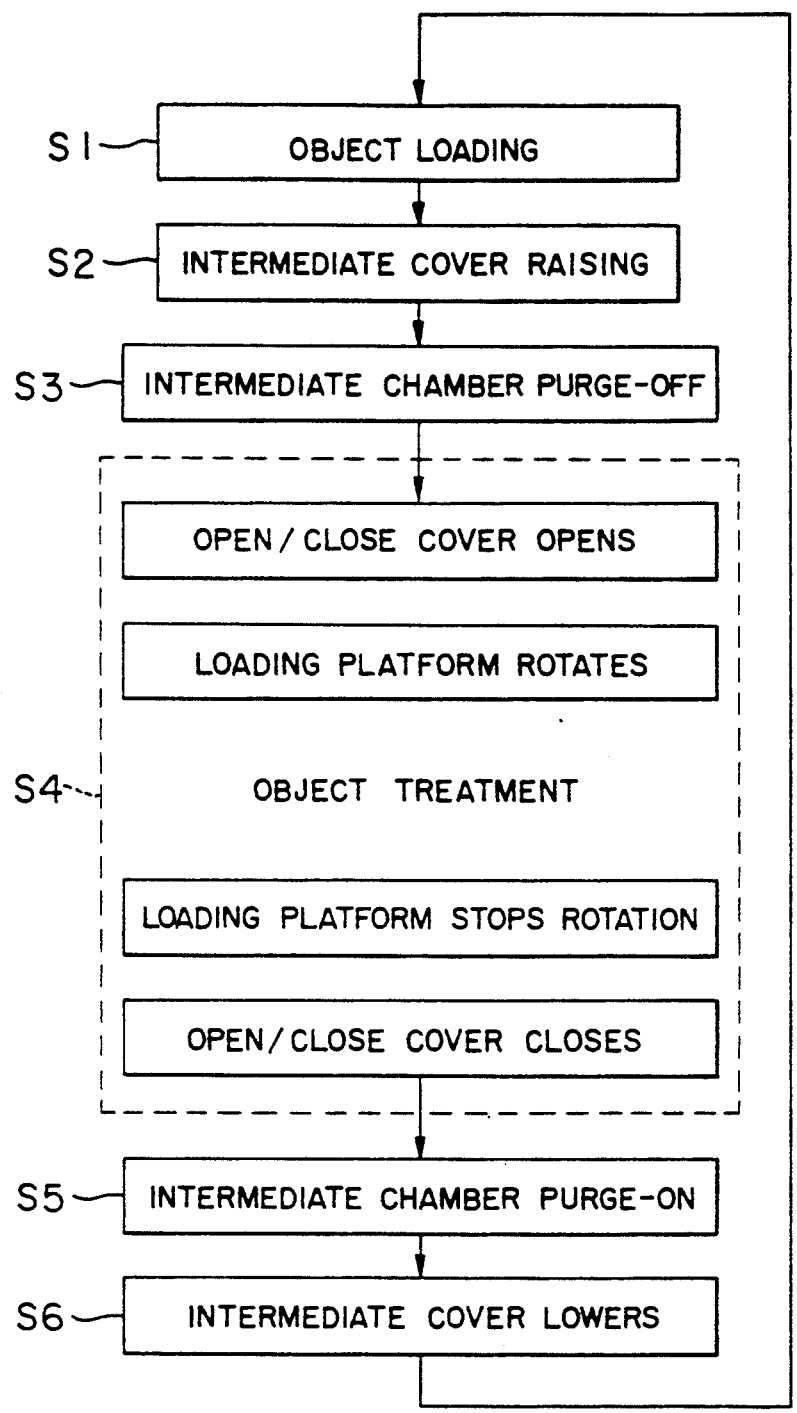
FIG. 5 is a chart showing operating steps of the natural oxidation film removing apparatus shown in FIG. 1.
Figure 6:
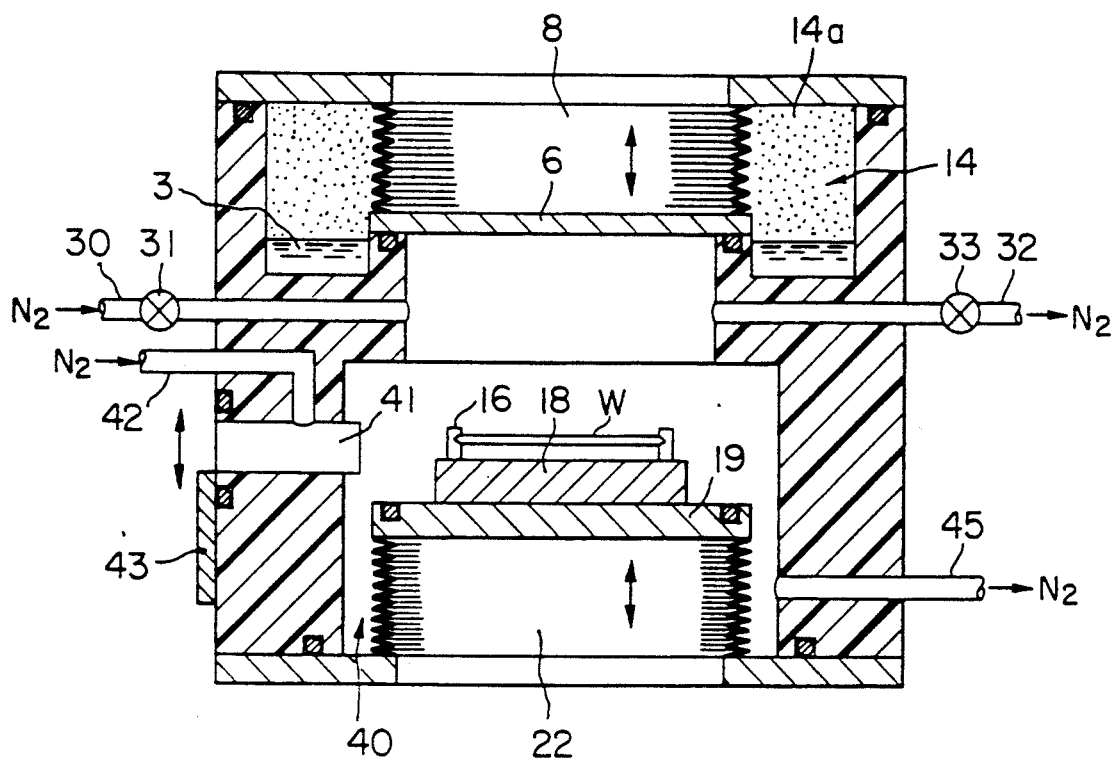
FIG. 6 shows one operating state of the natural oxidation film removing apparatus shown in FIG. 1.

In a treatment object loading step S1 indicated as a first step in FIG. 5, as indicated in FIG. 6, the intermediate cover 19 is lowered by the air cylinder 24, the gate valve 43 is opened, and the semiconductor wafer W is transported into the preparatory chamber 40 by the wafer transport mechanism 71. Then, the pins 16 are moved inward to close and the semiconductor wafer W is held by the pins 16 of the loading platform 18.

Thereafter, the wafer transport mechanism 71 moves to the outside of container 2 and the gate valve 43 is closed in order to seal the container 2.

In this state, the treatment gas atmosphere chamber 14 is sealed by the open/close cover 6, and the open/close valves 31 and 33 are opened.

Next, in an intermediate cover raising step S2 as a second step, as indicated in FIG. 1, the intermediate cover 19 is raised by the air cylinder 24, the sealing member 21 provided at the circumference of this intermediate cover 19 is pressed against the lower surface of the shoulder 20 provided on the inner side of the container 2 to hermetically separate the intermediate chamber 29 and the preparatory chamber 40.

In an intermediate cover purge-off step S3, the open/close valves 31 and 32 are closed in order to stop the N2 supply and exhaust to and from the intermediate chamber 29.

Figure 7:
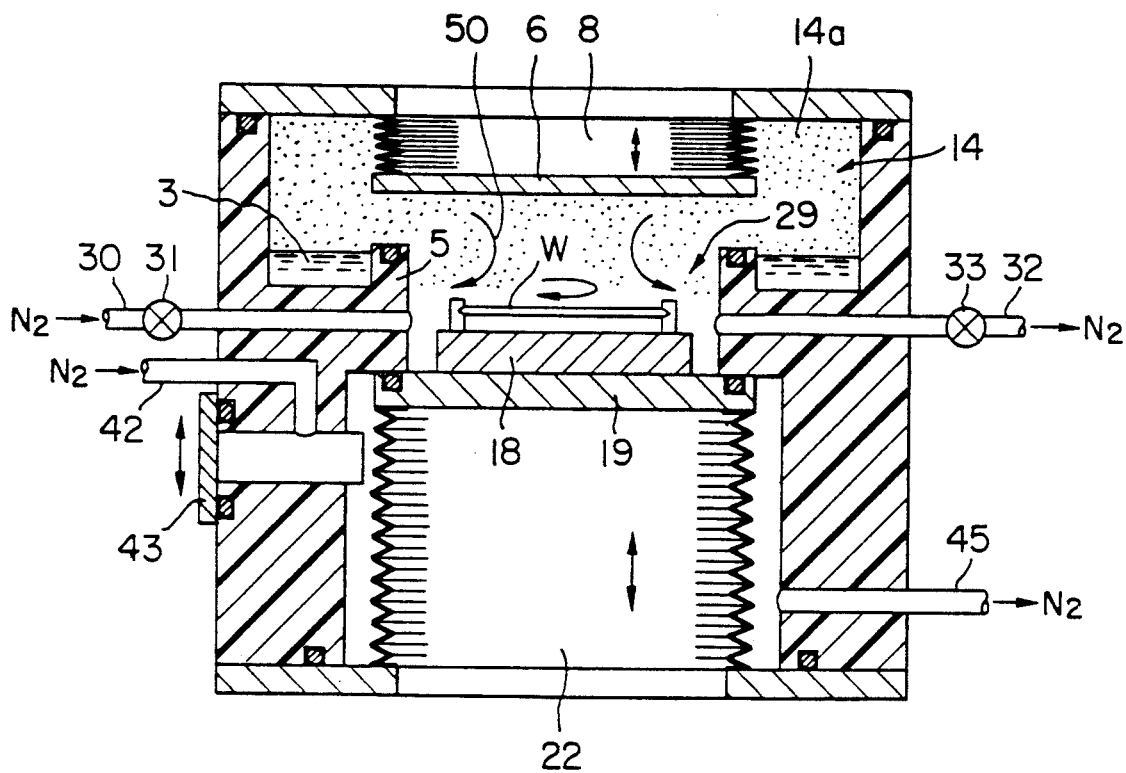
FIG. 7 shows another operating state of the natural oxidation film removing apparatus shown in FIG. 1.

In an object treatment step S4, the open/close cover 6 is raised and separated from the inner circumference wall 5 by the air cylinder 10 as indicated in FIG. 7, whereby the treatment gas atmosphere chamber 14 and the intermediate chamber 29 are brought into communication, while the loading platform 18 is rotated at, for example, 500 revolutions per minute by the motor 17, so that the wafer W is also rotated.

By this rotation of the semiconductor wafer W, treatment gas 14a charged in the treatment gas atmosphere chamber 14 becomes a gas flow 50 directed onto the surface of the semiconductor wafer W, and by this, the natural oxidation film formed on the semiconductor wafer W is uniformly removed.

After this treatment, the rotation of the loading platform 18 is stopped and the air cylinder 10 lowers the open/close cover 6 to again hermetically contact the inner circumference wall 5, thereby causing the intermediate chamber 29 and the treatment gas atmosphere chamber 14 to become mutually isolated separate chambers.

Next, in an intermediate chamber purge-on step S5, the open/close valve 31 is opened to supply N2 to the intermediate chamber 29 in order to dilute the residual treatment gas. Then by opening the open/close valve 33, the residual treatment gas is completely discharged to the exterior of the intermediate chamber 29 via the exhaust tube 32.

In an intermediate cover lowering process S6, the intermediate cover 19 is lowered by the air cylinder 24 and the gate valve 43 is opened. In addition, as indicated in FIG. 8, by the opening of the pins 16 that had held the semiconductor wafer W, the semiconductor wafer W is transported out by the wafer transport mechanism 71 to the robot chamber 70 and the gate valve 43 is closed.

The semiconductor wafer W transported to the robot chamber 70 by the wafer transport mechanism 71 is transported via a second gate valve 72 to the CVD apparatus 80. When the treatment quantity reaches, for example 100 wafers, an elevator mechanism 84 raises the wafers and heat (or CVD) treatment on the wafers is performed.

Then after the step S6, the first step of semiconductor wafer loading and the subsequent steps are repeated in sequence. When the steps are not to be repeated, the gate valve 43 is closed in order to seal the container 2 and set a standby mode.

The effects of the embodiment constructed in the above manner are as follows.

In the step S5, N2 is supplied to the intermediate chamber 29 by opening the open/close valve 31; residual treatment gas is diluted; and then by opening the open/close valve 33, the residual treatment gas is completely discharged from the intermediate chamber 29 to the exterior through the exhaust tube 32. The semiconductor wafer W is then lowered to the preparatory chamber 40 and transported out through the loading/unloading passage 41 by the transport mechanism. During this operation, treatment gas remaining after the treatment does not leak to the exterior from the container 2 through the loading/unloading passage 41. For this reason, corrosion of metal, wiring and other facilities provided at the exterior of the container 2 can be prevented.

Furthermore, in the state where the treatment object is held on the loading platform, the treatment object is subjected to the three atmospheres: the preparatory chamber atmosphere, the atmosphere in the intermediate chamber and the treatment atmosphere without need for shifting the treatment object. Therefore, contamination of the semiconductor elements from dust and other causes arising from shifting the treatment object can be prevented.

The foregoing has been a description of a natural oxidation removing apparatus for removing oxides as a result of natural oxidation, formed on a semiconductor wafer surface, but this invention is not limited by the above embodiment and numerous variations of embodiment are possible within the range of the objectives of this invention.

For example, regarding the raising-lowering and opening-closing mechanisms, instead of air cylinders, motors and other mechanisms may be used. This invention is not limited to a natural oxidation film removing apparatus, but is also applicable to preparatory treatment apparatus, such as cleaning, film forming and etching apparatus, as well as to every sort of treatment apparatus whereby surface treatment of a treatment object is performed by treatment gas under normal, reduced or increased pressure.

What is claimed is:

1. A method for surface treating of a treatment object comprising the steps of:
   transporting a treatment object into a preparatory chamber filled with an inert gas and holding the treatment object on a loading platform atop an intermediate cover in the preparatory chamber;
   closing the preparatory chamber with respect to the exterior;
   moving said intermediate cover toward an intermediate chamber located adjacent to and communicating with said preparatory chamber, so as to position the loading platform atop the intermediate cover and the treatment object held thereon in said intermediate chamber and to hermetically isolate said preparatory chamber and said intermediate chamber by said intermediate cover;
   opening an open/close cover, capable of communicating said intermediate chamber with a treatment gas atmosphere chamber adjacent thereto, to cause a treatment gas in said treatment gas atmosphere chamber to flow into the intermediate chamber and to cause the treatment gas to act on the treatment object;
   closing said open/close cover to isolate the treatment gas atmosphere chamber and the intermediate chamber;
   introducing an inert gas into said intermediate chamber to purge the treatment gas in the intermediate chamber to the exterior;
   moving said intermediate cover away from the intermediate chamber to communicate the intermediate chamber and the preparatory chamber and to cause the treatment object on the loading platform to be positioned in the preparatory chamber; and
   opening the preparatory chamber to the exterior to transport the treatment object to the exterior.

2. A method for surface treating in accordance with claim 1, further comprising the step of rotating the loading platform and the treatment object held thereby during the step of causing the treatment gas to act on the treatment object.

3. A surface treatment apparatus for a treatment object comprising:
   a container;
   preparatory chamber means formed in said container for receiving the treatment object;
   loading/unloading passage means provided in the container for transporting the treatment object into and removing the treatment object from said preparatory chamber;
   intermediate chamber means formed in said container adjacent to said preparatory chamber means;
   treatment gas atmosphere chamber means including a treatment gas therein and positioned in said container adjacent to said intermediate chamber means;
   an intermediate cover positioned within said intermediate chamber means and having a loading platform for receiving and holding thereon the treatment object, said intermediate cover being movable between a rearward position allowing transporting the treatment object via said loading/unloading passage means to and from said loading platform and a forward position for positioning the treatment object held on the loading platform in said intermediate chamber means so as to mutually and hermetically seal the preparatory chamber means and the intermediate chamber means;
   drive means for shifting said intermediate cover between said rearward position and said forward position;
   an open/close cover positioned between said intermediate chamber means and said treatment gas atmosphere chamber for mutually and hermetically sealing both the chamber means; and
   drive means for moving said open/close cover when said intermediate cover is at said forward position, so as to expose the treatment object on the loading platform in the intermediate chamber means to the treatment gas and to communicate the intermediate chamber with the treatment gas atmosphere chamber.

4. A surface treatment apparatus in accordance with claim 3, further comprising means for supplying an inert gas to said preparatory chamber means, and exhausting a gas from the preparatory chamber means.

5. A surface treatment apparatus in accordance with claim 3, further comprising means for supplying an inert gas to said intermediate chamber means and exhausting a gas from the intermediate chamber means.

6. A surface treatment apparatus in accordance with claim 3, wherein said preparatory chamber means is arranged at a low position, said intermediate chamber means is arranged atop the preparatory chamber means, and said treatment gas atmosphere chamber means is arranged atop the intermediate chamber means.

7. A surface treatment apparatus in accordance with claim 6, wherein said container is provided with an annular shoulder protruding to the inner side at an upper section of said preparatory chamber means, and at said forward position, said intermediate cover hermetically contacts said shoulder.

8. A surface treatment apparatus in accordance with claim 7, wherein said intermediate chamber is positioned at the inner side of said shoulder, and said loading platform is supported at the upper face of said intermediate cover.

9. A surface treatment apparatus in accordance with claim 7, wherein at an upper part of said shoulder, a rising inner circumference wall is provided so as to define said intermediate chamber, and at an upper face of said inner circumference wall, said open/close cover is hermetically contacted.

10. A surface treatment apparatus in accordance with claim 9, wherein an annular liquid containing chamber is provided around said inner circumference wall, to form a portion of said treatment gas atmosphere chamber means.

11. A surface treatment apparatus in accordance with claim 3, wherein said loading platform is supported on said intermediate cover in a manner that allows rotation, and drive means is provided for rotating the loading platform.

12. A treatment object film forming apparatus comprising robot chamber means, treatment object transporting means within the robot chamber means, treatment object loading/unloading chamber means connected via a gate valve to said robot chamber, and treatment chamber means for forming a film on the treatment object, connected via a gate valve to said robot chamber means; said apparatus further comprising a preparatory surface treatment apparatus which comprises:
 a container;
 preparatory chamber means formed in said container for receiving the treatment object;
 loading/unloading passage means provided in the container for transporting the treatment object into and removing the treatment object from said preparatory chamber;
 intermediate chamber means formed in said container adjacent to said preparatory chamber means;
 treatment gas atmosphere chamber means including a treatment gas therein and positioned in said container adjacent to said intermediate chamber means;
 an intermediate cover positioned within said intermediate chamber means and having a loading platform for receiving and holding thereon the treatment object, said intermediate cover being movable between a rearward position allowing transporting the treatment object via said loading/unloading passage means to and from said loading platform and a forward position for positioning the treatment object held on the loading platform in said intermediate chamber means so as to mutually and hermetically seal the preparatory chamber means and the intermediate chamber means;
 drive means for shifting said intermediate cover between said rearward position and said forward position;
 an open/close cover positioned between said intermediate chamber means and said treatment gas atmosphere chamber for mutually and hermetically sealing both the chamber means; and
 drive means for moving said open/close cover when said intermediate cover is at said forward position, so as to expose the treatment object on the loading platform in the intermediate chamber means to the treatment gas and to communicate the intermediate chamber with the treatment gas atmosphere chamber.

* * * * *